US008614591B2

(12) United States Patent
Kim et al.

(10) Patent No.: US 8,614,591 B2
(45) Date of Patent: Dec. 24, 2013

(54) MOTHER SUBSTRATE OF ORGANIC LIGHT EMITTING DISPLAYS CAPABLE OF SHEET UNIT TESTING AND METHOD OF SHEET UNIT TESTING

(75) Inventors: Kwang-Min Kim, Yongin (KR); Won-Kyu Kwak, Yongin (KR); Ji-Hyun Ka, Yongin (KR); Sam-Il Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 546 days.

(21) Appl. No.: 12/898,587

(22) Filed: Oct. 5, 2010

(65) Prior Publication Data

US 2011/0080173 A1 Apr. 7, 2011

(30) Foreign Application Priority Data

Oct. 7, 2009 (KR) ........................ 10-2009-0095165

(51) Int. Cl.
*G01R 31/02* (2006.01)

(52) U.S. Cl.
USPC ............ 324/762.07; 324/762.01; 324/760.01; 324/760.02; 324/403; 345/84; 345/76; 345/77; 345/78; 345/204; 345/214

(58) Field of Classification Search
USPC .................. 324/430, 760.01, 760.02, 762.01, 324/762.07; 345/76, 77, 78, 84, 204, 214
See application file for complete search history.

(56) References Cited

U.S. PATENT DOCUMENTS

| | | | | |
|---|---|---|---|---|
| 2007/0001711 | A1 | 1/2007 | Kwak | |
| 2007/0103406 | A1 * | 5/2007 | Kim | 345/76 |
| 2008/0054798 | A1 * | 3/2008 | Jeong et al. | 313/504 |

FOREIGN PATENT DOCUMENTS

| | | | |
|---|---|---|---|
| JP | 2007-052422 | | 3/2007 |
| JP | 2008-052235 | | 3/2008 |
| JP | 2008-158477 | | 7/2008 |
| JP | 2008-170941 | | 7/2008 |
| KR | 10-2007-0001583 | A | 1/2007 |
| KR | 10-0732819 | | 6/2007 |
| KR | 10-0833755 | B1 | 5/2008 |
| KR | 10-2008-0085575 | | 9/2008 |

OTHER PUBLICATIONS

KIPO Office action dated Aug. 29, 2011, for Korean priority Patent application 10-2009-0095165, noting references previously submitted in an IDS dated Feb. 2, 2011, 1 page.

(Continued)

*Primary Examiner* — Patrick Assouad
*Assistant Examiner* — Alexander J Nemtzow
(74) *Attorney, Agent, or Firm* — Christie, Parker & Hale, LLP

(57) ABSTRACT

A mother substrate including a plurality of organic light emitting display panels that include pixel circuits having a simple structure, is designed so that a sheet unit test may be performed while preventing or reducing brightness variation during sheet unit test, and a sheet unit test method for the mother substrate. The mother substrate also includes first and second wiring line groups and a compensating unit. The compensating unit is coupled to a coupling line for coupling a wiring line from among the first and second wiring line groups for transmitting a sheet unit test signal to the panels. The compensating unit is also for subtracting a voltage corresponding to a threshold voltage of a driving transistor included in a pixel of the panels from the sheet unit test signal before transmitting the sheet unit test signal to the panels.

12 Claims, 5 Drawing Sheets

(56) References Cited

OTHER PUBLICATIONS

JPO Office action dated Jan. 24, 2012 in corresponding application JP 2010-059223; 2 pages.

Office Action dated Jun. 12, 2012 issued in Japanese Patent Application Serial No. 2010-059223, which claims priority of corresponding Korean priority Application Serial No. 10-2009-0095165.

Office Action Jan. 14, 2011 corresponding to Korean Priority Application No. 10-2009-0095165.

* cited by examiner

MOTHER SUBSTRATE OF ORGANIC LIGHT EMITTING DISPLAYS CAPABLE OF SHEET UNIT TESTING AND METHOD OF SHEET UNIT TESTING

CROSS-REFERENCE TO RELATED APPLICATION

This application claims priority to and the benefit of Korean Patent Application No. 10-2009-0095165, filed on Oct. 7, 2009, in the Korean Intellectual Property Office, the entire content of which is incorporated herein by reference.

BACKGROUND

1. Field

Aspects of the present invention relate to a mother substrate of organic light emitting displays and a sheet unit test for such a mother substrate.

2. Description of Related Art

For reasons such as efficiency of manufacture and testing, the panels of a plurality of organic light emitting displays are formed on one mother substrate and later scribed into individual panels. In order to effectively produce a large number of organic light emitting displays, a production method of "sheet unit" in which the panels of the plurality of organic light emitting displays are formed on one mother substrate and then scribed into separate panels is used.

Tests for the divided panels of the organic light emitting displays may be performed on each panel by a panel unit test apparatus. However, in this case, since the panels must be separately tested, the efficiency of the testing deteriorates.

One way to address this deterioration is to perform the testing in units of sheets before the panels are separated from the mother substrate. To accomplish this, a plurality of sheet unit wiring lines for supplying power and/or signals for performing the sheet unit test to the plurality of panels are designed on the mother substrate. The sheet unit wiring lines may transmit the sheet unit test signals supplied from an external test apparatus to the insides of the panels through sheet unit test pads.

SUMMARY

Accordingly, embodiments of the present invention provide a mother substrate of organic light emitting displays designed so that a sheet unit test may be performed that is capable of preventing or reducing brightness variation during the sheet unit test of organic light emitting displays including pixel circuits having a simple structure, and a method of testing the sheet unit.

According to an embodiment of the present invention, a mother substrate is provided. The mother substrate includes a plurality of organic light emitting display panels arranged in a matrix, first and second wiring line groups, and a compensating unit. The first wiring line group includes a plurality of first wiring lines located at peripheries of the panels and extending in a first direction to transmit at least one of external test power or signals to the panels. The second wiring line group includes a plurality of second wiring lines located at peripheries of the panels and extending in a second direction that crosses the first direction to transmit at least one of external test power or signals to the panels. The compensating unit is coupled to a coupling line for coupling a wiring line from among the first and second wiring line groups for transmitting a sheet unit test signal to the panels. The compensating unit is configured to subtract a voltage corresponding to a threshold voltage of a driving transistor included in a pixel of the panels from the sheet unit test signal before transmitting the sheet unit test signal to the panels.

The compensating unit may include first and second transistors along with a capacitor. The first transistor is coupled between the wiring line for transmitting the sheet unit test signal and a pad of the panels, and configured to receive the sheet unit test signal. The second transistor is coupled between a gate electrode of the first transistor and a drain electrode of the first transistor to diode-couple the first transistor in a period where the sheet unit test signal is transmitted in accordance with a first switching signal. The capacitor is coupled between the gate electrode of the first transistor and a gate high-level voltage source.

The compensating unit may further include a third transistor coupled between the drain electrode of the first transistor and a reset voltage source. The third transistor is for initializing the voltage of the drain electrode of the first transistor in a reset period before a period where the sheet unit test signal is transmitted, in accordance with a second switching signal.

The compensating unit may be positioned on an other side of a scribing line from one of the panels that receives the sheet unit test signal via the compensating unit.

Each of the panels may include a pad unit, a display unit, a scan driver, first and second testing units, and a data distributing unit. The pad unit includes a plurality of pads for transmitting power and signals to the panels. The display unit includes a plurality of pixels positioned at crossing regions of data lines and scan lines. The scan driver is for supplying scan signals to the scan lines. The first testing unit includes a plurality of first test transistors coupled between one end of the data lines and the pad unit to supply an array test signal or a reset voltage supplied through the pad unit to the data lines. The data distributing unit is coupled between the first testing unit and the data lines to distribute and output the array test signal or the reset voltage supplied from each of the first test transistors to the data lines. The second testing unit includes a plurality of second test transistors coupled between an other end of the data lines and the compensating unit to transmit the sheet unit test signal supplied from the compensating unit to the data lines.

The first testing unit and the data distributing unit may be further configured to turn on in a reset period before a period where the sheet unit test signal is transmitted through the second testing unit in a sheet unit test period to supply the reset voltage transmitted from the pad unit to the data lines.

Each of the panels may include red pixels that emit light corresponding to red light, green pixels that emit light corresponding to green light, and blue pixels that emit light corresponding to blue light. The wiring line that transmits the sheet unit test signal may include at least three wiring lines that transmit red sheet unit test signals, green sheet unit test signals, and blue sheet unit test signals to the red pixels, the green pixels, and the blue pixels, respectively. The compensating unit may include compensating circuits coupled to the at least three wiring lines.

The sheet unit test signal may be a lighting test signal or an aging signal.

The panels may include a plurality of pixels for displaying an image. Each of the pixels includes an organic light emitting diode (OLED) coupled between a first pixel power and a second pixel power, a driving transistor coupled between the first pixel power and the OLED, a storage capacitor coupled between a gate electrode of the driving transistor and a source electrode of the driving transistor, and a switching transistor coupled between the gate electrode of the driving transistor and a data line and having a gate electrode coupled to a scan line.

In accordance with another embodiment of the present invention, a sheet unit test method of testing a mother substrate of organic light emitting displays is provided. The mother substrate includes a plurality of panels. Each of the panels includes a plurality of pixels positioned at crossing regions of scan lines and data lines, and a plurality of wiring lines located at peripheries of the plurality of panels to supply test power or signals to the plurality of panels. The method includes supplying sheet unit test signals to the data lines of the plurality of panels using some of the wiring lines, and subtracting voltages corresponding to threshold voltages of driving transistors included in the pixels from the sheet unit test signals before transmitting the sheet unit test signals to the panels.

The sheet unit test signals may be supplied to the panels via transistors that are diode-coupled to the some of the wiring lines.

The method may further include supplying a reset voltage to the data lines of the plurality of panels using other of the wiring lines before supplying the sheet unit test signals.

As described above, according to the present invention, the sheet unit wiring lines are designed on the mother substrate so that the sheet unit test may be performed. The compensating unit for compensating the threshold voltages of the driving transistors is coupled to an input line of the sheet unit test signals to prevent or reduce brightness variation during the sheet unit test in the organic light emitting display that has a simple structured pixel circuit, and to effectively perform aging.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
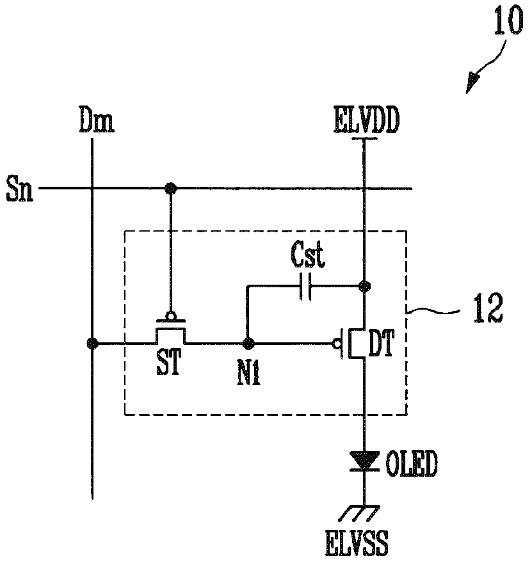
FIG. 1 is a circuit diagram illustrating a pixel of an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via a third element. Further, some of the elements that are not essential to a complete understanding of the invention are omitted for clarity. In addition, like reference numerals refer to like elements throughout.

In the case of the organic light emitting display that includes pixel circuits having a simple structure in which a compensation circuit for compensating for threshold voltages of driving transistors is not formed in a pixel, brightness variation (or deviation) may be generated between the pixels and/or the panels during the sheet unit test so that the correctness of the test may deteriorate. In addition, in this case, when aging is performed in units of sheets, aging may not be uniformly applied.

FIG. 1 is a circuit diagram illustrating a pixel of an organic light emitting display according to an embodiment of the present invention. For the sake of convenience, in FIG. 1, the pixel coupled to an nth scan line Sn and an mth data line Dm is illustrated.

Referring to FIG. 1, a pixel 10 includes an organic light emitting diode (OLED) and a pixel circuit 12 for controlling driving current that flows to the OLED. An anode electrode of the OLED is coupled to a first pixel power ELVDD via the pixel circuit 12 and a cathode electrode of the OLED is coupled to a second pixel power ELVSS. Here, the first pixel power ELVDD may be set as a high potential pixel power and the second pixel power ELVSS may be set as a low potential pixel power. The OLED emits light with brightness corresponding to the driving current supplied from the pixel circuit 12.

The pixel circuit 12 includes a switching transistor ST, a driving transistor DT, and a storage capacitor Cst.

A first electrode of the switching transistor ST is coupled to the data line Dm and a second electrode of the switching transistor ST is coupled to a first node N1. Here, the first electrode and the second electrode are different electrodes. For example, the first electrode may be a source electrode and the second electrode may be a drain electrode. A gate electrode of the switching transistor ST is coupled to the scan line Sn. The switching transistor ST is turned on when a scan signal (e.g., a low level signal) is supplied to the scan line Sn to supply a data signal (from the data line Dm) to the first node N1.

A first electrode of the driving transistor DT is coupled to the first pixel power ELVDD and a second electrode of the driving transistor DT is coupled to the anode electrode of the OLED. A gate electrode of the driving transistor DT is coupled to the first node N1. The driving transistor DT controls the driving current that flows from the first pixel power ELVDD to the anode electrode of the OLED in accordance with a voltage supplied to the gate electrode of the driving transistor DT.

One electrode of the storage capacitor Cst is coupled to the first node N1 and another electrode of the storage capacitor Cst is coupled to the first pixel power ELVDD and the first electrode (e.g., a source electrode) of the driving transistor DT. The storage capacitor Cst stores the voltage corresponding to the data signal supplied to the first node N1 when the scan signal is supplied to the scan line Sn and maintains the stored voltage during one frame.

The operation processes of the pixel 10 will now be described in detail. First, when the scan signal is supplied to the scan line Sn, the switching transistor ST is turned on. When the switching transistor ST is turned on, the data signal supplied to the data line Dm is supplied to the first node N1 via the switching transistor ST. When the data signal is supplied to the first node N1, the voltage corresponding to the data signal is charged in the storage capacitor Cst. Then, the driving transistor DT controls the driving current that flows from the first pixel power ELVDD to the OLED in accordance with a voltage Vgs (e.g., the voltage corresponding to the data signal) between the gate and source of the driving transistor DT. As a result, the OLED emits light with the brightness corresponding to the data signal to display an image.

In the pixel 10 in which the pixel circuit 12 is designed to have the above-described simple structure, the driving transistor DT supplies the driving current corresponding to the voltage obtained by subtracting a threshold voltage Vth from the voltage between the gate and source of the driving transistor DT to the OLED.

However, variation (or deviation) in a value of the threshold voltage of the driving transistor may be generated in each panel or pixel due to process variation. Brightness variation between pixels or between panels may be generated by the variation in the threshold voltage.

In order to prevent or reduce the generation of the brightness variation, additional elements for compensating for the threshold voltage may be formed in the pixel circuit 12. Another option is to supply a data signal that compensates for the threshold voltage from outside of the pixel 10. In the latter case, the structure of the pixel 10 is simplified. However, a sheet unit test performed on a mother substrate may not be effectively performed.

In more detail, the sheet unit test on the mother substrate is performed when a data driver is not mounted on each panel. The sheet unit test signals are supplied from an external test apparatus to sheet unit test pads so that the sheet unit test signals are supplied to the panels through sheet unit wiring lines.

In this case, the sheet unit test signal, which does not account for possible threshold voltage variation, is supplied to the panels and the brightness variation is generated between panels or pixels according to the threshold voltages of the driving transistors in the entire mother substrate. Consequently, the correctness of the test deteriorates. In addition, an aging signal is supplied as a sheet unit test signal to perform aging. In this case, the threshold voltage variation is not compensated for so that the aging may not be uniformly applied.

Therefore, according to embodiments of the present invention, there is provided a mother substrate of organic light emitting displays designed so that a sheet unit test may be performed that is capable of preventing or reducing brightness variation during the sheet unit test of the organic light emitting displays, and a method of testing the sheet unit. Detailed description of the above will be described with reference to FIGS. 2 to 6.

Figure 2:
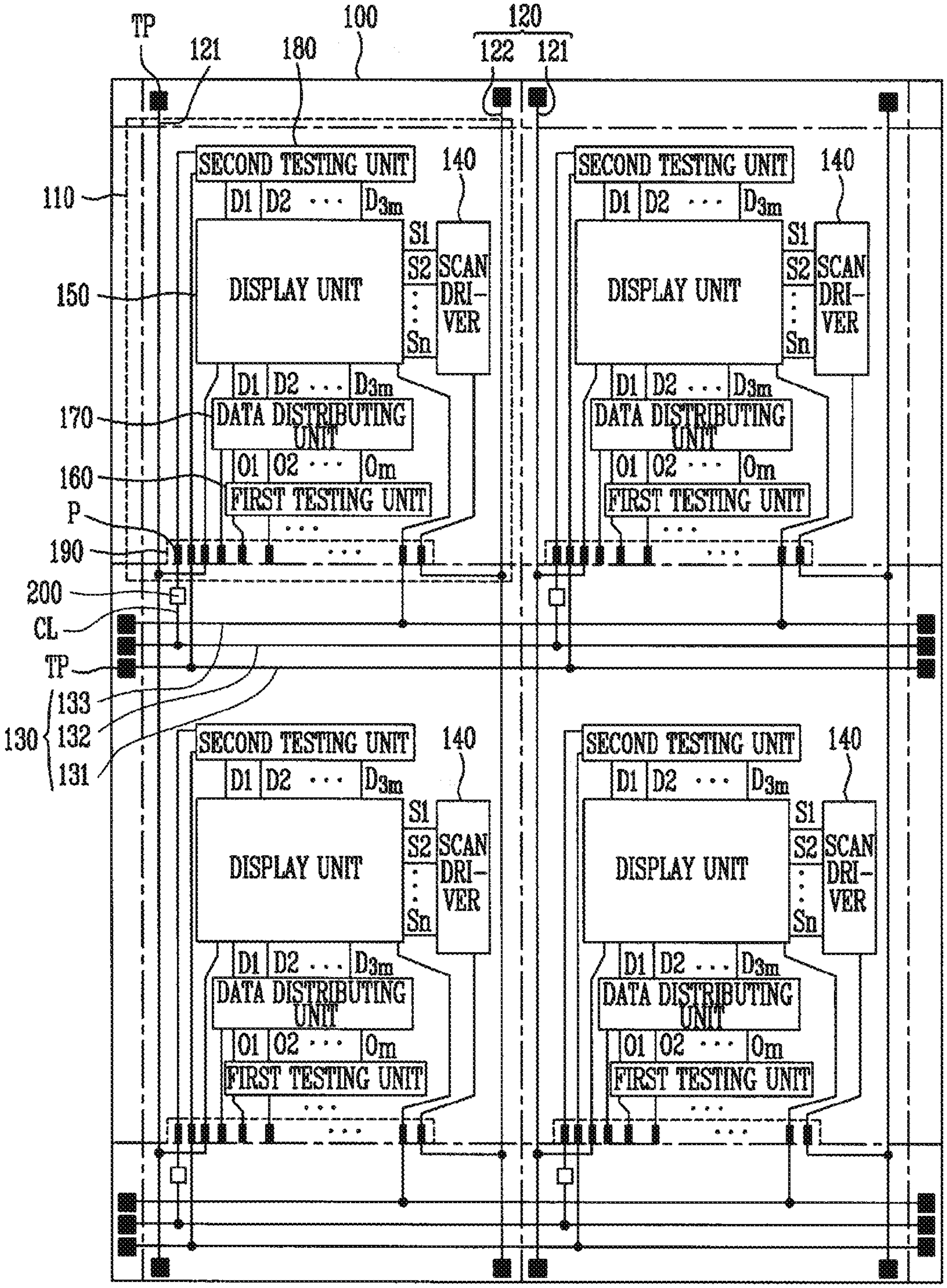
FIG. 2 is a plan view schematically illustrating a mother substrate of organic light emitting displays according to an embodiment of the present invention.
Figure 3:
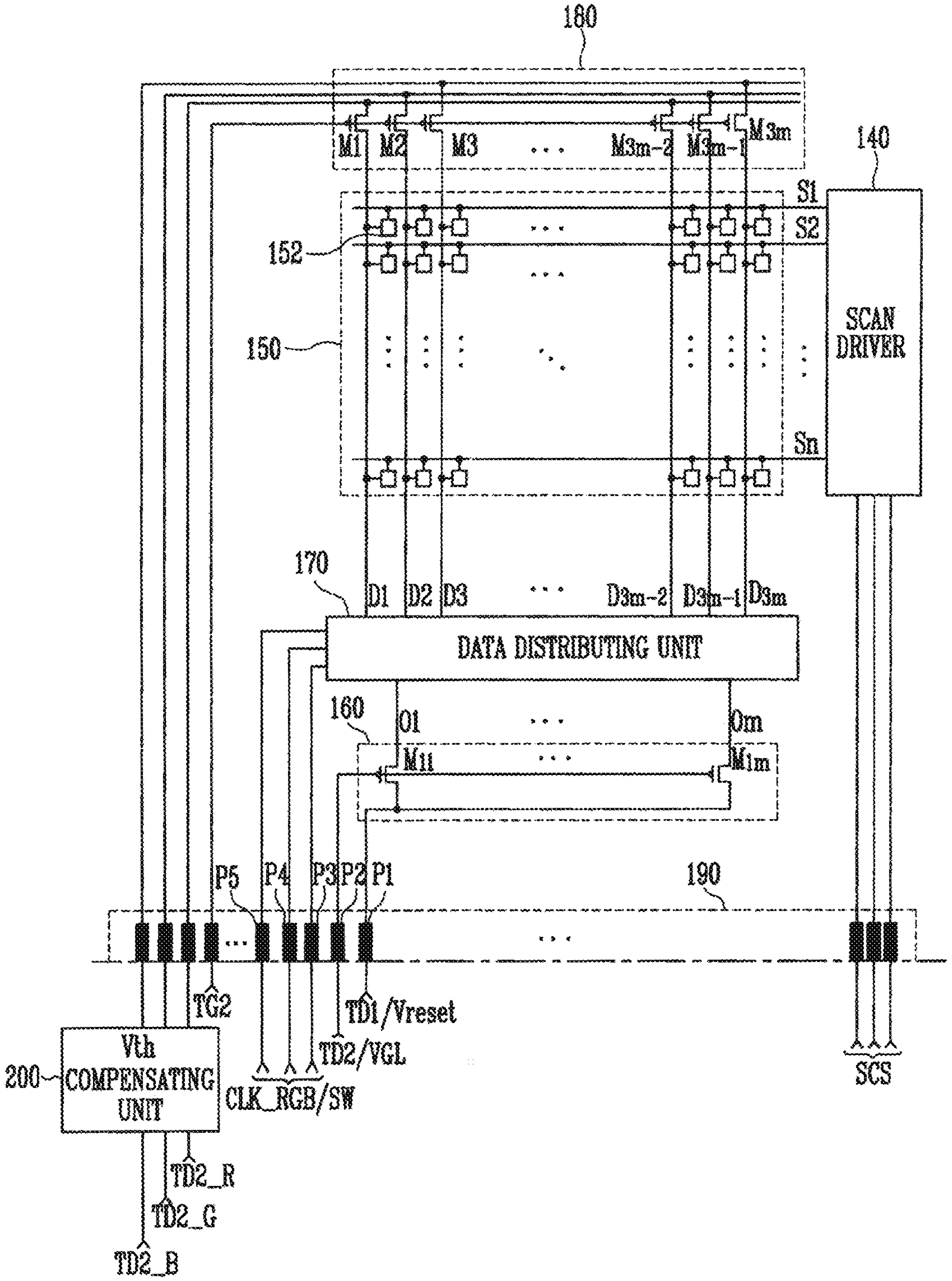
FIG. 3 is a plan view of a display panel that illustrates detailed structures and operations of a first testing unit and a second testing unit of FIG. 2.

FIG. 2 is a plan view schematically illustrating a mother substrate of organic light emitting displays according to an embodiment of the present invention. FIG. 3 is a plan view of a display panel that illustrates detailed structures and operations of a first testing unit and a second testing unit of FIG. 2.

Referring to FIGS. 2 and 3, a mother substrate 100 of the organic light emitting displays according to an embodiment of the present invention includes panels 110 of the organic light emitting displays arranged in a matrix and a first wiring line group 120 and a second wiring line group 130 located at peripheries of the panels 110. Each of the panels 110 includes a scan driver 140, a display unit 150, a first testing unit 160, a data distributing unit 170, a second testing unit 180, and a pad unit 190.

The scan driver 140 generates scan signals to correspond to first and second scan driving power and scan control signals SCS supplied via the pad unit 190 from the outside and sequentially supplies the scan signals to scan lines S1 to Sn.

The display unit 150 includes a plurality of pixels 152 positioned at crossing regions of data lines D1 to D3*m* and the scan lines S1 to Sn. Here, each of the pixels 152 may have a simple structure as illustrated in FIG. 1.

The first testing unit 160 is electrically coupled to one end of the data lines D1 to D3*m* through the data distributing unit 170 to supply an array test signal TD1 (e.g., for array testing) or a reset voltage Vreset to the data lines D1 to D3*m* (e.g., for possible use during sheet unit testing).

In more detail referring now to FIG. 3, the first testing unit 160 includes a plurality of first test transistors M11 to M1*m* coupled between one end of each of the data lines D1 to D3*m* (via the data distributing unit 170) and the pad unit 190 to supply the array test signal TD1 or the reset voltage Vreset supplied through the pad unit 190 to the data lines D1 to D3*m*. Here, source electrodes of the first test transistors M11 to M1*m* are commonly coupled to a first pad P1 included in the pad unit 190 and drain electrodes of the first test transistors M11 to M1*m* are coupled to the data lines D1 to D3*m* via the data distributing unit 170. Gate electrodes of the first test transistors M11 to M1*m* are commonly coupled to a second pad P2 included in the pad unit 190.

The first test transistors M11 to M1*m* are concurrently (e.g., simultaneously) turned on in accordance with an array test control signal TD2 supplied from the second pad P2 to output the array test signal TD1 supplied from the first pad P1 to the data distributing unit 170 while an array test is performed. Then, the array test signal TD1 output to the data distributing unit 170 is transmitted to the data lines D1 to D3*m* by the data distributing unit 170.

In addition, after the array test is completed, the first test transistors M11 to M1*m* are commonly and continuously turned off. For example, while the sheet unit test using the second testing unit 180 is performed, the first test transistors M11 to M1*m* may be continuously turned off.

When a Vth compensating unit 200 according to embodiments of the present invention does not include a driving element for initializing the data lines D1 to D3*m*, the first test transistors M11 to M1*m* are turned on by a gate low level VGL supplied from the second pad P2 in a reset period during a sheet unit test period to supply the reset voltage Vreset supplied from the pad P1 to the data lines D1 to D3*m*, which will be described later in reference to FIG. 6.

The first testing unit 160 is continuously turned off after testing of the panels 110 is completed and the panels 110 are scribed from the mother substrate 100. For example, the first testing unit 160 may be stably continuously turned off in accordance with a bias signal supplied from the pad unit 190 in a period where the panels 110 are actually driven.

The data distributing unit 170 is coupled between the first testing unit 160 and the data lines D1 to D3*m* to distribute and output the array test signal TD1 or the reset voltage Vreset supplied to output lines O1 to Om via the first test transistors M11 to M1*m* to the plurality of data lines D1 to D3*m*. Here, the data distributing unit 170 may have a demultiplexer (DEMUX) structure that is known to those skilled in the art. Accordingly, a detailed description of the circuit structure of the data distributing unit 170 is omitted.

The data distributing unit 170 receives red, green, and blue clock signals CLK_RGB through third to fifth pads P3, P4, and P5 included in the pad unit 190 while the array test is performed, and distributes and outputs the array test signal TD1 to the data lines D1 to D3*m* while being driven in accordance with the red, green, and blue clock signals CLK_RGB.

In addition, in some embodiments, the data distributing unit 170 is continuously turned off while the sheet unit test is performed. In other embodiments, the data distributing unit 170 is turned on in accordance with a switching signal SW supplied by sheet unit wiring lines to output the reset voltage Vreset supplied from the first testing unit 160 to the data lines D1 to D3*m*.

After testing of the panels 110 is completed and the panels 110 are scribed from the mother substrate 100, the data distributing unit 170 distributes and outputs the data signals supplied from the output lines of the data driver (not shown) to the data lines D1 to D3*m*. The data driver may be mounted on the scribed panel 110 in the form of an integrated circuit (IC) chip to overlap with the first testing unit 160.

The array test processes using the first testing unit 160 and the data distributing unit 170 will now be described in detail. First, the array test signal TD1, the array test control signal TD2, and the red, green, and blue clock signals CLK_RGB are supplied to the first to fifth pads P1 to P5 using an array test apparatus.

Then, the first test transistors M11 to M1*m* are turned on in accordance with the array test control signal TD2. This results in the array test signal TD1 supplied from the first pad P1 to be output to the output lines O1 to Om.

Then, the data distributing unit 170 distributes and outputs the array test signal TD1 supplied from the output lines O1 to Om of the first testing unit 160 to the data lines D1 to D3*m* of red, green, and/or blue pixels in accordance with the red, green, and blue clock signals CLK_RGB. Thus, the array test may be performed for the panels 110.

In addition, signals for the array test are supplied to transistors (not shown), the scan signals (S1 to Sn), and/or the pixel power lines included in the scan driver 140 to test the coupling state of the transistors (not shown), the scan signals (S1 to Sn), and/or the pixel power lines.

Sheet unit testing will now be described. The second testing unit 180 is coupled between other ends of the data lines D1 to D3*m* (at the second testing unit 180) and the Vth compensating unit 200 to transmit red, green, and blue sheet unit test signals TD2_R, TD2_G, and TD2_B supplied from the sheet unit wiring lines to the panel 110 via the Vth compensating unit 200 to the data lines D1 to D3*m*. The sheet unit test signals TD2_R, TD2_G, and TD2_B may be set, for example, as light test signals or aging signals.

The second testing unit 180 includes input lines to which the red, green, and blue sheet unit test signals TD2_R, TD2_G, and TD2_B are input and a plurality of second test transistors M1 to M3*m* coupled between the data lines D1 to D3*m*. In addition, gate electrodes of the second test transistors M1 to M3*m* are commonly coupled to an input line to which sheet unit test control signal TG2 is input through a third sheet unit wiring line 131.

The second test transistors M1 to M3*m* are concurrently (e.g., simultaneously) turned on in accordance with the sheet unit test control signal TG2 supplied in a sheet unit test period to transmit the sheet unit test signals TD2_R, TD2_G, and TD2_B supplied via the Vth compensating unit 200 to the data lines D1 to D3*m*.

Processes of performing the sheet unit test using the second testing unit 180 will now be described in detail. First, when the sheet unit test control signal TG2 is supplied from the third sheet unit wiring line 131, the second test transistors M1 to M3*m* are turned on. Therefore, the sheet unit test signals TD2_R, TD2_G, and TD2_B supplied from a fourth sheet unit wiring line 132 are supplied to the data lines D1 to D3*m* via the Vth compensating unit 200 and the second testing unit 180.

The first scan driving power, the second scan driving power, and the scan control signals SCS are supplied from a second sheet unit wiring line 122 (which may include multiple wiring lines) of the first wiring line group 120 to the scan driver 140. Then, the scan driver 140 sequentially generates scan signals to supply the generated scan signals to the display unit 150. Therefore, the pixels 152 that received the scan signals and the sheet unit test signals TD2_R, TD2_G, and TD2_B emit light to display an image so that the sheet unit test such as a lighting test is performed.

When the sheet unit test using first and second wiring line groups 120 and 130 is not being performed, the second testing unit 180 is continuously turned off. For example, during the array test using the first testing unit 160 and the data distributing unit 170 (e.g., the array test signal TD1 and the sheet unit test signals TD2_R, TD2_G, and TD2_B are supplied at different times) or after the panels 110 are scribed from the mother substrate 100, the second testing unit 180 may be continuously turned on in accordance with the bias signal supplied from the pad unit 190. That is, the second testing unit 180 is not used for driving the panel 110 but remains as a transistor group after scribing.

Referring now to FIG. 2, the pad unit 190 includes a plurality of pads P for transmitting the power and/or signals supplied from the outside to the panel 110. The first wiring line group 120 includes a plurality of sheet unit wiring lines located at the peripheries of the panels 110, for example, on the boundaries between the panels 110 to extend in a first direction (e.g., a vertical direction) to transmit the testing power and/or signals supplied from the outside through the sheet unit test pads (TP) to the panels 110.

For example, the first wiring line group 120 may include a first sheet unit wiring line 121 for transmitting the first pixel power ELVDD and the second sheet unit wiring line 122 for transmitting the scan driving power and the scan control signals SCS. Here, the second sheet unit wiring line 122 is illustrated as one wiring line, however, may actually include a plurality of wiring lines. For example, the second sheet unit wiring line 122 may include five wiring lines that receive a first scan driving power VDD, a second scan driving power VSS, a start pulse SP, a scan clock signal CLK, and an output enable signal OE. The number of second sheet unit wiring lines may vary in accordance with the circuit structure of the scan driver 140.

The first wiring line group 120 is commonly coupled to the panels 110 arranged in a same column to transmit the test power and/or signals supplied to the first wiring line group 120 to the panels 110 coupled to the first wiring line group 120 during the sheet unit test.

The second wiring line group 130 includes a plurality of other sheet unit wiring lines located at the peripheries of the panels 110, for example, on the boundaries between the panels 110 to extend in a second direction (e.g., a horizontal direction) that intersects (or crosses) the first direction to transmit the test power and/or signals supplied from the outside through the sheet unit test pads TP to the panels 110.

For example, the second wiring line group 130 may include the third sheet unit wiring line 131 for transmitting the sheet unit test control signal TG2, the fourth sheet unit wiring line 132 for transmitting the sheet unit test signals TD2_R, TD2_G, and TD2_B, and a fifth sheet unit wiring line 133 for transmitting the second pixel power ELVSS. Here, the fourth sheet unit wiring line 132 is illustrated as one wiring line, however, may actually include a plurality of wiring lines. For example, the fourth sheet unit wiring line 132 may include three wiring lines that transmit the red sheet unit test signal TD2_R, the green sheet unit test signal TD2_G, and the blue sheet unit test signal TD2_B.

The second wiring line group 130 is commonly coupled to the panels 110 arranged in a same row to transmit the test power and/or signals supplied to the second wiring line group 130 to the panels 110 coupled to the second wiring line group 130 during the sheet unit test.

According to exemplary embodiments, for the mother substrate 100 of the above-described organic light emitting display, a failure test of the panels 110 may be performed in the sheet unit state where the panels 110 are not scribed.

The testing of the panels 110 may be divided into an array test and a sheet unit test. The array test for testing the coupling state of the transistors and/or wiring lines included in the panels 110 is performed before the OLEDs are formed, that is, between a process of forming the transistors and a process of forming the OLEDs.

The array test is performed in units of panels 110 in order to first detect the panel 110 in which a coupling state such as a wiring line is defective and to repair the failure if necessary so that subsequent processes such as the process of forming the OLED may be performed. That is, the array test may be performed by supplying the signals and/or power for the array test to the pad unit 190 or exposed signal lines and power lines and/or electrodes in units of the panels 110 using an external array test apparatus (not shown) and by detecting the current that flows through the wiring lines and/or the transistors or the voltages applied to the wiring lines and/or the transistors.

In particular, during the array test, the array test signal TD1 is supplied to the first testing unit 160 through the pad unit 190 and the array test signal TD1 supplied to the first testing unit 160 is transmitted to the data lines D1 to D3*m* via the data distributing unit 170.

As described above, array test signals are supplied to the panels 110 to check the coupling state (e.g., whether open failure or short failure is generated) of the wiring lines and/or the transistors located in the panels 110. The sheet unit test for performing the lighting test and/or aging of the panels 110 on the mother substrate is performed after the process of forming the OLED is completed.

The above-described sheet unit test is performed on the plurality of panels 110 where the array test is completed on the mother substrate 100 so that the efficiency of the test is improved. In order to perform the test on the panels 110 in units of sheets, sheet unit wiring lines (e.g., the first and second wiring line groups 120 and 130) for coupling the plurality of panels 110 are formed and the signals and/or power for performing test on the plurality of panels 110 through the sheet unit wiring lines are supplied.

Here, the sheet unit test may be performed by supplying the sheet unit test signals to the second testing unit 180 when the first testing unit 160 and the data distributing unit 170 are open circuits. That is, the sheet unit test signals TD2_R, TD2_G, and TD2_B and the array test signal TD1 are not concurrently supplied.

Therefore, at least one wiring line (not shown) electrically coupled to the first testing unit 160 and the data distributing unit 170 to supply the bias signal to the first testing unit 160 and the data distributing unit 170 while the sheet unit test is performed may be further included in the first and/or second wiring line groups 120 and 130.

The at least one wiring line may be included in order to prevent the erroneous operation of at least part of the panels 110 due to signal delay generated in a process of concurrently supplying the power and the signals to the plurality of panels 110 through the first and second wiring line groups 120 and 130.

In detail, the distance from the sheet unit test pad TP to which the power and/or signals for the sheet unit test are supplied to the panel 110 positioned in the center of the mother substrate 100 increases as the panel 110 is closer to the center of the mother substrate 100. Accordingly, a signal delay may become severe while passing through the first and second wiring line groups 120 and 130, so that such a center panel 110 that receives the delayed power and/or signals may erroneously operate.

In particular, when delay is generated in the red, green, and blue clock signals CLK_RGB supplied to the data distributing unit 170, sufficient time for charging a data voltage may not be available to the pixel circuit so that a correct image is not displayed or it is difficult to synchronize the sheet unit test control signal TG2 and the clock signals CLK_RGB.

Therefore, during the sheet unit test through the first and second wiring line groups 120 and 130, the sheet unit test signals TD2_R, TD2_G, and TD2_B are not supplied through the data distributing unit 170. Instead, the second testing unit 180 is provided to supply the sheet unit test signals TD2_R, TD2_G, and TD2_B so that the erroneous operation of the panel 110 is prevented. That is, the array test of the data distributing unit 170 is performed in the array test on the panels 110 and the data distributing unit 170 is turned off while the sheet unit test is performed.

The second testing unit 180 includes a plurality of second test transistors M1 to M3*m* concurrently (e.g., simultaneously) turned on by the same sheet unit test control signal TG2 to supply the sheet unit test signals TD2_R, TD2_G, and TD2_B to the data lines D1 to D3*m*. Accordingly, it is possible to prevent synchronization from being made difficult when the delayed signal is input to the data distributing unit 170 and to prevent erroneous operations from being generated. Therefore, the sheet unit test such as the lighting test may be effectively performed.

According to another embodiment of the present invention to be described later, in order to initialize the data lines D1 to D3*m* during the sheet unit test, the first testing unit 160 and the data distributing unit 170 may be turned on in a reset period. However, in this case, the input lines to which the clock signals CLK_RGB of the data distributing unit 170 are input are commonly coupled to one sheet unit wiring line (not shown) and are operated by one switching signal SW, so problems related to synchronization are not generated.

As described above, for a mother substrate 100 of the organic light emitting displays according to an embodiment of the present invention, the sheet unit test on the panels 110 located on the mother substrate 100 may be performed and the test power and/or signals supplied to the plurality of panels 110 through the first and second wiring line groups 120 and 130 so that the test may be performed in units of sheets.

Therefore, it is possible to reduce test time and test cost so that test efficiency may be improved. Furthermore, even if the circuit wiring lines that constitute the panel 110 change or the size of the panel 110 changes, if the circuit wiring lines of the first and second wiring line groups 120 and 130 and the size of the mother substrate 100 do not change, the test may be performed without changing a test apparatus or a jig.

According to embodiments of the present invention, the Vth compensating unit 200 is coupled to a coupling wiring line CL for coupling the fourth sheet unit wiring line 132 for transmitting the sheet test signals TD2_R, TD2_G and TD2_B among the sheet unit wiring lines included in the first and second wiring line groups 120 and 130 to the panels 110. The Vth compensating unit 200 subtracts the voltages corresponding to the threshold voltages of the driving transistors included in the pixels 152 of the panels 110 from the sheet unit test signals TD2_R, TD2_G, and TD2_B and supplies the subtraction results to the panels 110.

When the panels 110 include red pixels that emit red light (or light corresponding to red light), green pixels that emit green light (or light corresponding to green light), and blue pixels that emit blue light (or light corresponding to blue light), and the fourth sheet unit wiring line 132 for transmitting the sheet unit test signals TD2_R, TD2_G, and TD2_B includes at least three wiring lines that transmit the red sheet unit test signal TD2_R, the green sheet unit test signal TD2_G, and the blue sheet unit test signal TD2_B, the Vth compensating unit 200 may be coupled to the at least three wiring lines.

That is, according to embodiments of the present invention, the sheet unit test signals TD2_R, TD2_G, and TD2_B are supplied to the data lines D1 to D3*m* of the plurality of panels 110 using some of the sheet unit wiring lines among the sheet unit wiring lines and the voltages corresponding to the threshold voltages of the driving transistors included in the pixels 152 are subtracted from the sheet unit test signals TD2_R, TD2_G, and TD2_B so that the subtraction results are supplied to the panels 110.

Therefore, transistors that are diode-coupled in a period where the sheet unit test signals TD2_R, TD2_G, and TD2_B are supplied, and having similar or the same threshold voltages as the driving transistors included in the pixels 152, are provided in the Vth compensating unit 200. In addition, the sheet unit test signals TD2_R, TD2_G, and TD2_B are supplied to the panels 110 via the transistors when the transistors are diode-coupled.

As described above, according to embodiments of the present invention, the sheet unit wiring lines are designed on the mother substrate 100 so that the sheet unit test may be performed and the Vth compensating unit 200 for compensating for the threshold voltages of the driving transistors is coupled to the input lines through which the sheet unit test signals TD2_R, TD2_G, and TD2_B are input to the panel 110. Therefore, although an organic light emitting display includes pixels having a simple structured pixel circuit, brightness variation during the sheet unit test caused by threshold voltage variation is prevented or reduced, and aging may be effectively performed.

The Vth compensating unit 200 is positioned on the other side of the scribing line of the panel 110 that receives the sheet unit test signals TD2_R, TD2_G, and TD2_B via the Vth compensating unit 200. Therefore, the Vth compensating unit 200 is electrically insulated from the other elements of the panel 110 after scribing so that the Vth compensating unit 200 does not affect the driving of the panel 110.

Figure 4:
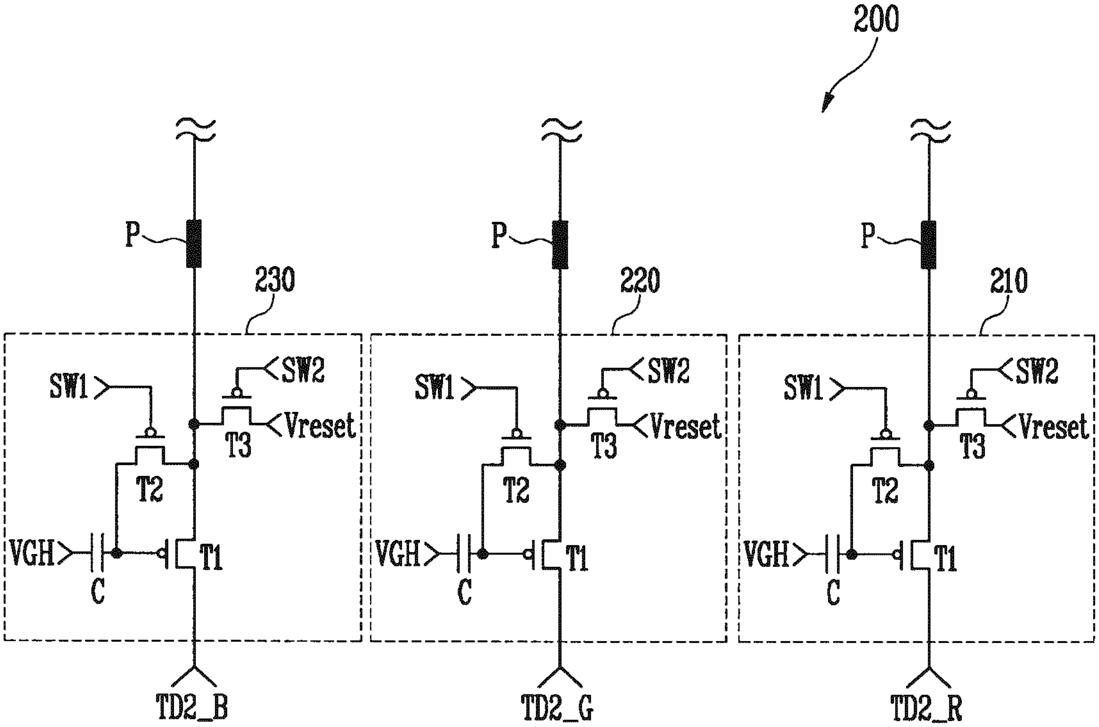
FIG. 4 is a circuit diagram illustrating an example of a Vth compensating unit of FIG. 3.
Figure 5:
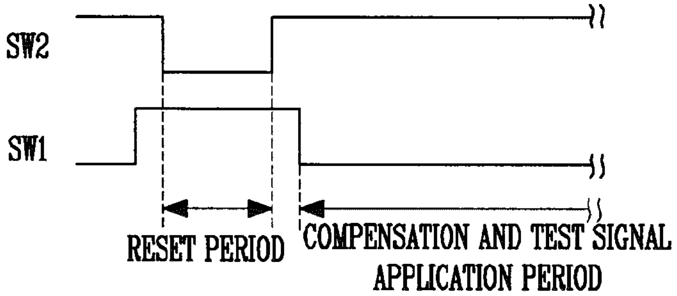
FIG. 5 is a waveform diagram illustrating a method of driving the Vth compensating unit of FIG. 4.

FIG. 4 is a circuit diagram illustrating an example of a Vth compensating unit of FIG. 3. FIG. 5 is a waveform diagram illustrating a method of driving the Vth compensating unit of FIG. 4.

First, referring to FIG. 4, the Vth compensating unit 200 includes first to third compensating circuits 210, 220, and 230 coupled to the sheet unit wiring lines for transmitting the red, green, and blue sheet unit test signals TD2_R, TD2_G, and TD2_B, respectively. Since the first to third compensating circuits 210, 220, and 230 each include first to third transistors T1 to T3 and a capacitor C and have the same structure, hereinafter, the structure of the Vth compensating unit 200 will be described primarily in reference to one of the compensating circuits.

The Vth compensating unit 200 includes a first transistor T1, a second transistor T2, a third transistor T3, and a capacitor C. The first transistor is coupled between the sheet unit wiring lines for transmitting the sheet unit test signals TD2_R, TD2_G, and TD2_B and a pad P of the panels that receive the sheet unit test signals TD2_R, TD2_G, and TD2_B. The second transistor T2 is coupled between a gate electrode of the first transistor T1 and a drain electrode of the first transistor T1, for diode-coupling the first transistor T1 in a period where the sheet unit test signals TD2_R, TD2_G, and TD2_B are transmitted in accordance with a first switching signal SW1. The third transistor T3 is coupled between the drain electrode of the first transistor T1 and a reset voltage source Vreset of the first transistor T1, for initializing a voltage of the drain electrode of the first transistor T1 in a reset period before the sheet test signals TD2_R, TD2_G, and TD2_B are supplied in accordance with a second switching signal SW2. The capacitor C is coupled between the gate electrode of the first transistor T1 and a gate high-level voltage source VGH.

A method of driving the Vth compensating unit 200 will be described with reference to the waveform diagram of FIG. 5. First, the first switching signal SW1 in a high level and the second switching signal SW2 in a low level are supplied in the reset period. Therefore, the second transistor T2 is turned off and the third transistor T3 is turned on.

When the third transistor T3 is turned on, the voltage of the drain electrode of the first transistor T1 is initialized by a voltage of the reset voltage source Vreset. The voltage of the reset voltage source Vreset is set to be low so that a direction from the sheet unit wiring lines to which the sheet unit test signals TD2_R, TD2_G, and TD2_B are input to the pad P may become a forward diode-coupling direction of the first transistor T1 in a subsequent compensation and test signal application period. Then, since the data lines of the panel may be coupled to the drain electrode of the first transistor T1 via the second testing unit, the data lines may also be initialized.

In the reset period, the first transistor T1 is affected by the gate high level voltage source VGH by the capacitor C to be continuously turned off. Then, in the compensation and test signal application period, the first switching signal SW1 in a low level and the second switching signal SW2 in a high level are supplied. Therefore, the third transistor T3 is turned off and second transistor T2 is turned on.

When the second transistor T2 is turned on, the first transistor T1 is diode-coupled. Therefore, the sheet unit test signals TD2_R, TD2_G, and TD2_B each have subtracted from them the threshold voltage of the first transistor T1 via the first transistor T1 to be input to the pad P. The sheet unit test signals TD2_R, TD2_G, and TD2_B input to the pad P are supplied to the data lines by the second testing unit.

The threshold voltage of the first transistor T1 is designed to correspond to the threshold voltages of the driving transistors included in the pixels. For example, the threshold voltage of the first transistor T1 may be designed to have a similar value or the same value as the threshold voltages of the driving transistors.

Therefore, since the pixel receives the sheet unit test signals TD2_R, TD2_G, and TD2_B from which the threshold voltages are first subtracted, threshold voltage effect is offset in the driving current supplied to the OLED by the driving transistors so that the generation of brightness variation of the panels and the pixels is prevented or reduced.

Figure 6:
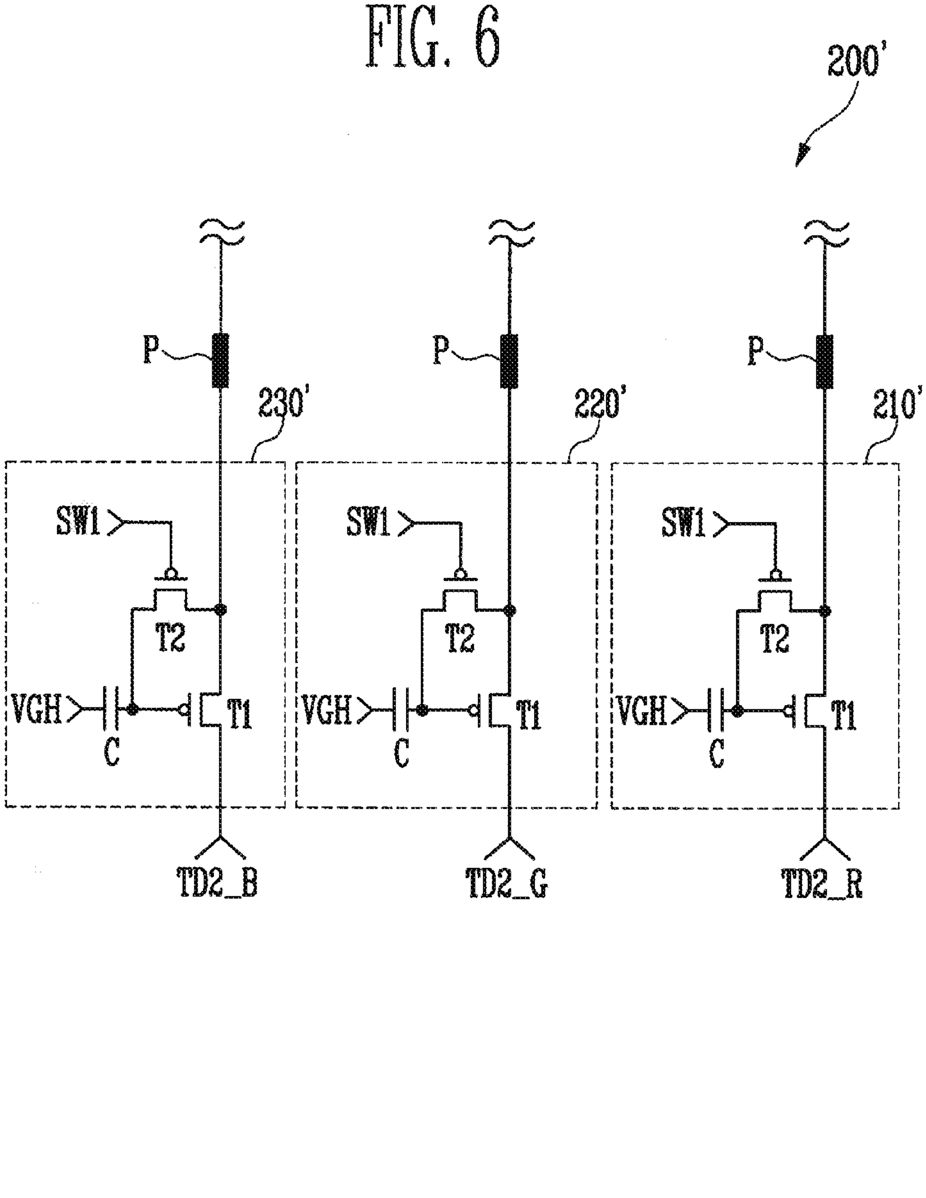
FIG. 6 is a circuit diagram illustrating another example of the Vth compensating unit of FIG. 3.

FIG. 6 is a circuit diagram illustrating another example of the Vth compensating unit of FIG. 3. For the sake of convenience, in FIG. 6, detailed description of the same elements as FIG. 4 will be omitted.

Referring to FIG. 6, a Vth compensating unit 200' does not include the third transistor T3 of FIG. 4. Therefore, the voltage of the reset voltage source is not supplied to the data lines.

In this case, in the reset period before the sheet unit test signals TD2_R, TD2_G, and TD2_B from which the threshold voltages are subtracted by the first and second transistors T1 and T2 are supplied, the reset voltage Vreset may be supplied using the first testing unit 160 and the data distributing unit 170 of FIG. 3.

That is, when the elements for initializing the Vth compensating unit 200' are omitted, before supplying the sheet unit test signals TD2_R, TD2_G, and TD2_B to the panels in the sheet test period, the reset voltage Vreset may be supplied to the data lines D1 to D3*m* using the first testing unit 160 and the data distributing unit 170. In detail, when the switching signal SW and the gate low level voltage VGL are supplied to the data distributing unit 170 and the first testing unit 160, respectively, so that the switching signal SW and the gate low level voltage VGL are turned on, the reset voltage Vreset is supplied to the source electrodes of the first test transistors M11 to M1*m* so that the reset voltage Vreset may be supplied to the data lines D1 to D3*m*.

Therefore, in the first or second wiring line groups, the sheet unit wiring lines for supplying the low level voltage VGL and the reset voltage Vreset to the first testing unit 160 and the sheet unit wiring lines for supplying the switching signal SW to the data distributing unit 170 may be additionally provided. Then, the input wiring lines for supplying the red, green, and blue clock signals CLK_RGB to the data distributing unit 170 may be commonly coupled to one sheet unit wiring line.

When the above-described Vth compensating unit 200' is used, the third transistor T3 may be omitted in comparison with the Vth compensating unit 200 of FIG. 4. Therefore, the Vth compensating unit 200' becomes simpler so that designing becomes easier and thus, the first transistor T1 may be designed larger. As a result, it is possible to improve threshold voltage compensating ability.

In addition, since the first testing unit 160 and the data distributing unit 170 are driven during the sheet unit test, it may be determined whether the distributing unit 170 is normally driven during the sheet unit test.

While aspects of the present invention have been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A mother substrate, comprising:

a plurality of organic light emitting display panels arranged in a matrix;

a first wiring line group comprising a plurality of first wiring lines located at peripheries of the panels and extending in a first direction to transmit at least one of external test power or signals to the panels;

a second wiring line group comprising a plurality of second wiring lines located at peripheries of the panels and extending in a second direction that crosses the first direction to transmit at least one of external test power or signals to the panels; and a compensating unit coupled to a coupling wiring line for coupling a sheet unit wiring line from among the first and second wiring line groups to one of the panels, the sheet unit wiring line being configured to transmit a sheet unit test signal to at least two of the panels, the compensating unit being configured to subtract a voltage corresponding to a threshold voltage of a driving transistor included in a pixel of the one of the panels from the sheet unit test signal before transmitting the sheet unit test signal to the pixel of the one of the panels.

2. The mother substrate as claimed in claim 1, wherein the compensating unit comprises:

a first transistor coupled between the coupling wiring line, the coupling wiring line being configured to transmit the sheet unit test signal, and a pad of the panels, and configured to receive the sheet unit test signal;

a second transistor coupled between a gate electrode of the first transistor and a drain electrode of the first transistor to diode-couple the first transistor in a sheet unit test period where the sheet unit test signal is transmitted, in accordance with a first switching signal; and a capacitor coupled between the gate electrode of the first transistor and a gate high-level voltage source.

3. The mother substrate as claimed in claim 2, wherein the compensating unit further comprises a third transistor coupled between the drain electrode of the first transistor and a reset voltage source, for initializing the voltage of the drain electrode of the first transistor in a reset period before the sheet unit test period, in accordance with a second switching signal.

4. The mother substrate as claimed in claim 1, wherein the compensating unit is positioned on an other side of a scribing line from the one of the panels that receives the sheet unit test signal via the compensating unit.

5. The mother substrate as claimed in claim 1, wherein the compensating unit comprises a plurality of compensating units, and each panel of the panels comprises:

a pad unit comprising a plurality of pads for transmitting power and signals to the panel;

a display unit comprising a plurality of pixels positioned at crossing regions of data lines and scan lines;

a scan driver for supplying scan signals to the scan lines;

a first testing unit comprising a plurality of first test transistors coupled between one end of the data lines and the pad unit to supply an array test signal or a reset voltage supplied through the pad unit to the data lines;

a data distributing unit coupled between the first testing unit and the data lines to distribute and output the array test signal or the reset voltage supplied from each of the first test transistors to the data lines; and a second testing unit comprising a plurality of second test transistors coupled between an other end of the data lines and a corresponding one of the compensating units to transmit the sheet unit test signal supplied from the one of compensating units to the data lines.

6. The mother substrate as claimed in claim 5, wherein the first testing unit and the data distributing unit are configured to turn on in a reset period before a sheet unit test period where the sheet unit test signal is transmitted through the second testing unit, to supply the reset voltage transmitted from the pad unit to the data lines.

7. The mother substrate as claimed in claim 1, wherein each of the panels comprises red pixels that emit light corresponding to red light, green pixels that emit light corresponding to green light, and blue pixels that emit light corresponding to blue light, wherein the sheet unit wiring line comprises at least three wiring lines that transmit red sheet unit test signals, green sheet unit test signals, and blue sheet unit test signals to the red pixels, the green pixels, and the blue pixels, respectively, of the one of the panels, and wherein the compensating unit comprises compensating circuits coupled to the at least three wiring lines.

8. The mother substrate as claimed in claim 1, wherein the sheet unit test signal is a lighting test signal or an aging signal.

9. The mother substrate as claimed in claim 1, wherein the panels comprise a plurality of pixels for displaying an image, and wherein each of the pixels comprises:

an organic light emitting diode (OLED) coupled between a first pixel power and a second pixel power;

a driving transistor coupled between the first pixel power and the OLED;

a storage capacitor coupled between a gate electrode of the driving transistor and a source electrode of the driving transistor; and a switching transistor coupled between the gate electrode of the driving transistor and a data line and having a gate electrode coupled to a scan line.

10. A sheet unit test method of testing a mother substrate of organic light emitting displays comprising a plurality of panels, each of the panels comprising a plurality of pixels positioned at crossing regions of scan lines and data lines, and a plurality of sheet unit wiring lines located at peripheries of the plurality of panels to supply test power or signals to the plurality of panels via a plurality of coupling wiring lines, the method comprising:

supplying sheet unit test signals to the data lines of the plurality of panels using some of the coupling wiring lines; and subtracting voltages corresponding to threshold voltages of driving transistors included in the pixels from the sheet unit test signals before transmitting the sheet unit test signals to the data lines of the panels.

11. The method as claimed in claim 10, wherein the sheet unit test signals are supplied to the data lines of the panels via transistors that are diode-coupled to the some of the coupling wiring lines.

12. The method as claimed in claim 10, further comprising supplying a reset voltage to the data lines of the plurality of panels using other of the coupling wiring lines before supplying the sheet unit test signals.

* * * * *